(12) United States Patent
Simpson et al.

(10) Patent No.: US 6,225,193 B1
(45) Date of Patent: May 1, 2001

(54) METHOD OF CLEAVING A SEMICONDUCTOR WAFER INCLUDING IMPLANTING AND ANNEALING RESULTING IN EXFOLIATION

(75) Inventors: Todd William Simpson; Ian Vaughan Mitchell, both of London; Grantley Oliver Este, Dunrobin; Frank Reginald Shepherd, Kanata, all of (CA)

(73) Assignee: Nortel Networks Limited, Montreal (CA)

( * ) Notice: Subject to any disclaimer, the term of this patent is extended or adjusted under 35 U.S.C. 154(b) by 0 days.

(21) Appl. No.: 09/377,054

(22) Filed: Aug. 19, 1999

(30) Foreign Application Priority Data

Aug. 28, 1998 (CA) ................................................ 2246087

(51) Int. Cl.[7] .................................................... H01L 21/78
(52) U.S. Cl. ............................................ 438/460; 438/462
(58) Field of Search .................................. 438/460, 462, 438/465

(56) References Cited

U.S. PATENT DOCUMENTS

| 4,824,800 | * | 4/1989 | Takano ................................. 438/577 |
| 5,614,445 | * | 3/1997 | Hirabayashi .......................... 438/430 |
| 5,904,546 | * | 5/1999 | Wood et al. .......................... 438/460 |

* cited by examiner

Primary Examiner—Wael Fahmy
Assistant Examiner—William M. Brewster
(74) Attorney, Agent, or Firm—Victoria Donnelly

(57) ABSTRACT

A method of cleaving a semiconductor wafer comprising a deep ion implantation induced selective area of exfoliation. The method includes steps of selectively masking the material with a mask having edges parallel to natural cleavage planes of the semiconductor material, implanting unmasked regions of the material with light ions of hydrogen or helium, and annealing to cause exfoliation of the material from the implanted regions. As a result of exfoliation, the patterned structure remaining on the wafer and pieces of the exfoliated material have high quality sidewall-facets which provides cleaved facets along the cleavage planes of the material. A method of manufacturing optoelectronic devices and semiconductor laser devices is provided.

26 Claims, 6 Drawing Sheets

METHOD OF CLEAVING A SEMICONDUCTOR WAFER INCLUDING IMPLANTING AND ANNEALING RESULTING IN EXFOLIATION

RELATED APPLICATION

The present application is related to the U.S. patent application Ser. No. 09/377,053 entitled "METHOD OF PATTERNING OF SEMICONDUCTOR MATERIALS AND OTHER BRITTLE MATERIALS" to the same inventors, filed concurrently herewith and incorporated herein by reference.

FIELD OF THE INVENTION

The present invention relates to a method of cleaving a semiconductor wafer, and in particular to a method of cleaving a semiconductor wafer to form microelectronic and optoelectronic devices.

BACKGROUND OF THE INVENTION

Semiconductor wafers for semiconductor and optoelectronic applications are conventionally separated into individual dice by cleaving along a preferential crystal orientation. Cleaving is promoted by forming scribe lines or edge nicks in the material to generate a fracture location. Compound III–V semiconductor materials are commonly used in the fabrication of integrated circuits and optoelectronic devices, e.g. lasers and optical amplifiers. Such optoelectronic devices conventionally have a Fabry-Perot cavity wherein high quality cleaved end surfaces serve as the cavity mirrors. Alternatively, distributed feedback (DFB) or distributed Bragg reflector (DBR) type lasers, or other devices such as semiconductor Mach Zehnder modulators may also require optical quality cleaved facets. There may be as many as 10,000 devices on a 1" diameter wafer. After defining device structures, the semiconductor wafer is separated into individual elements by cleaving. A high yield at the cleaving stage is critical.

The wafer is usually cleaved into quarters which are subsequently cleaved into bars wherein each bar contains a plurality of side-by-side devices. These bars are then cleaved to separate the individual elements.

The cleaving process is traditionally a manual operation with a skilled operator using a probe to initiate crack propagation within either a scribed laser bar or a wafer quarter. This is labour intensive process and the yield of good devices is often dependent on the skill and ability of the operator. Further, as new and different laser structures are introduced into production or as production volumes increase more operators are required to meet the increased workload. It is difficult to control and ensure the consistency of a purely manual skill, even with a small workforce. As extra staff is introduced to the operation, additional training and close monitoring is required.

Accordingly, there is a need in the industry for alternative methods of cleaving semiconductor wafers which would avoid manual operation and provide high yield of laser devices with high quality cleaved facets.

SUMMARY OF THE INVENTION

Thus, the present invention seeks to provide a method of cleaving a semiconductor wafer which would avoid or reduce the afore-mentioned problems.

Therefore, according to a first aspect of the present invention there is provided a method of cleaving a semiconductor wafer, comprising the steps of:

selectively masking a semiconductor wafer;

ion implanting unmasked regions of the wafer to a predetermined depth;

annealing the wafer to cause exfoliation of the material from the implanted regions.

The dose of ion implantation, the depth of ion penetration, and the rate and temperature of the annealing are determined so as to cause exfoliation, and separation of the material from the implanted regions, thereby patterning the material, by ion induced selective area exfoliation. Voids form in the implanted region during annealing at the predetermined depth and cause explosive exfoliation, causing cleavage of the material along boundaries of the implanted regions, as will be described in detail below.

Advantageously, the step of masking comprises providing a mask having edges parallel to natural cleavage planes of the semiconductor material, to facilitate cleavage to form optical quality sidewall facets. The mask may be removed before of after annealing, as required.

Typical ions for the ion implantation step are the light ions of hydrogen or helium or isotopes thereof. Inert gases, e.g. neon or its isotopes, are an alternative choice.

Preferably, annealing comprises rapid thermal annealing to cause exfoliation. Other known annealing processes may be used which provide the required heating rate and temperature to cause exfoliation. Annealing of the material is performed, for example, by rapid thermal annealing, furnace annealing, annealing by use of electron beams, ion beams, or laser beams, or a combination of annealing processes. All of these methods provide thermal heating of the material up to a required temperature causing exfoliation.

The appropriate selection of masks and implantation provides the desired exfoliation of the material and cleaving of the wafer to form sidewall-facets.

Typical materials selected for the mask may include metals, e.g. gold, nickel or aluminum; dielectrics, e.g. silicon dioxide or silicon nitride; organic materials, e.g. photoresist; or a combination thereof.

The materials used for the mask must be thick enough to stop the implanted ions, robust enough to withstand the implantation without significant deformations and preferably allows required control of an edge profile of the mask. Preferably, the mask is defined by use of photo-lithography, etching and lift-off techniques. The mask may be removed by plasma ashing, chemical etching, mechanical polishing, or ion etching, depending on the masking material selected, the processes being well known in the semiconductor industry. The mask may be removed either before or after the annealing, as required.

The steps of masking and implanting may be repeated a number of times before performing the step of annealing to cause exfoliation and cleaving of the wafer to form sidewall-facets. That is, masking and implanting with different ions, energies and doses in different areas of the sample may be performed several times before the annealing. A mask may be removed after each implantation, or, alternatively, all the masks may be removed together either before or after the annealing step. Similarly to the above, the steps of masking, implanting and annealing may be repeated as many times as needed, with annealing after each implantation to remove regions of the wafer by exfoliation. Several implantations may be used for different patterns.

According to another aspect of the invention there is provided a method of cleaving a semiconductor wafer to define optoelectronic devices, comprising the steps of:

forming an optoelectronic device structure in the surface of the wafer;

selectively masking the semiconductor wafer with a mask having edges parallel to natural cleavage planes of the semiconductor material;

ion implanting unmasked regions of the wafer with ions to a pre-determined depth;

annealing the wafer to cause exfoliation of the material from the implanted regions.

The method above provides defining of optoelectronic devices on the wafer, for example, optoelectronic devices including laser devices, having active regions formed on the wafer. Annealing causes exfoliation of the material from the implanted regions, with cleaving of the material to form sidewall-facets. The mask has straight edges parallel to natural cleavage planes of the semiconductor material, which facilitates cleaving to form high quality facets.

Preferably, the ions penetrate into the wafer below the active region, and thus cause separation of the optoelectronic device structures, for example laser devices formed in the surface of the wafer. The patterned structure remaining on the wafer after exfoliation forms a first set of laser devices. The collected pieces of exfoliated material may form a second set of laser devices, with sidewall-facets serving as laser facets for each set. The orientation of sidewall-facets depends on orientation of the direction of ion implantation with respect to the crystallographic directions, i.e. cleavage planes, of the wafer, for example, to form vertical facets or facets inclined at a pre-determined angle.

Advantageously after cleaving, the laser devices may further be tested, the testing of the first set of laser structures being performed on the wafer. Further steps of the method may include coating laser facets of the first set of laser devices, and detaching laser devices of the first set from the wafer.

BRIEF DESCRIPTION OF THE DRAWINGS

The invention will now be described in greater detail with references to the attached drawings wherein:

FIG. 1 schematically illustrates sequential steps of the method of cleaving a semiconductor wafer according to a first embodiment of the invention, wherein:

FIG. 1b illustrates ion implantation of the wafer of FIG. 1a;

FIG. 5 schematically illustrates sequential steps of the method of manufacturing semriconductor laser devices according to a second embodiment of the invention, wherein:

DETAILED DESCRIPTION OF THE PREFERRED EMBODIMENTS

Figure 1A:
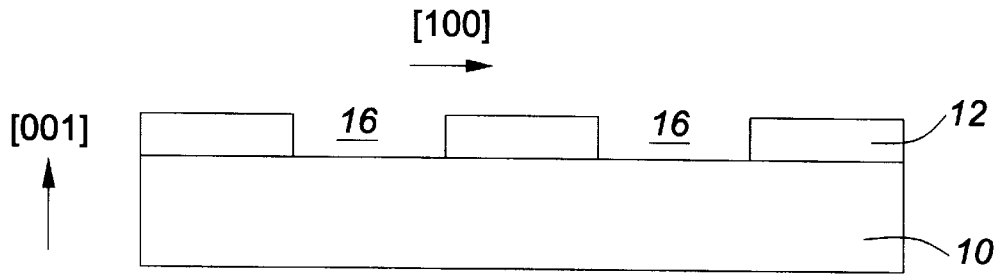
FIG. 1a illustrates selective masking of the wafer.
Figure 1B:
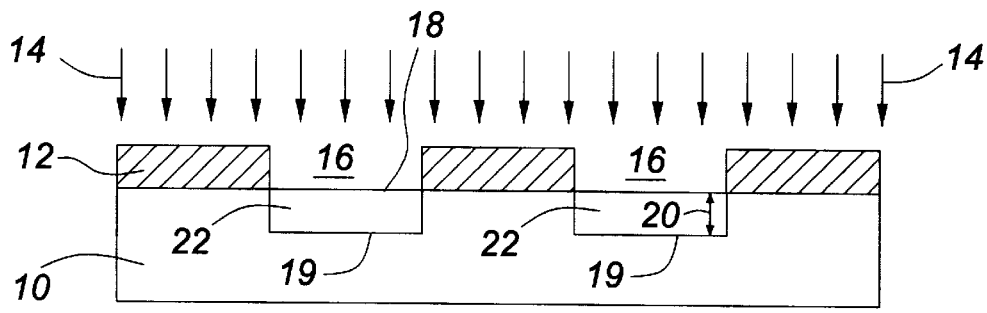
Figure 1C:
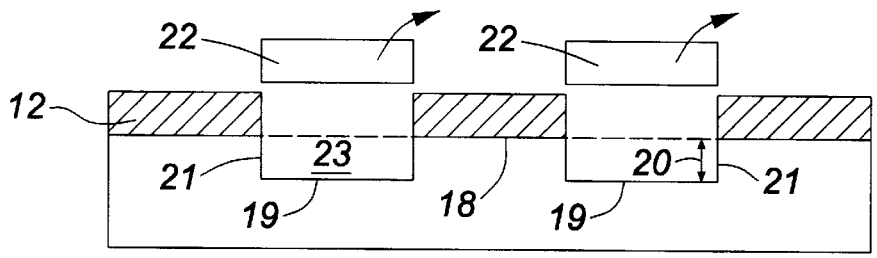
FIG. 1c illustrates thermal annealing of the wafer of FIG. 1b and selective exfoliation of the implanted regions.
Figure 1D:
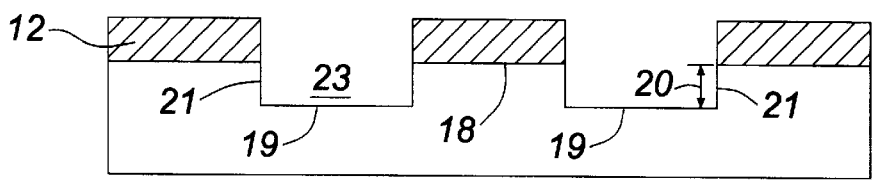
FIG. 1d illustrates a structure remaining on the wafer after thermal annealing and exfoliation of the implanted regions.
Figure 1E:
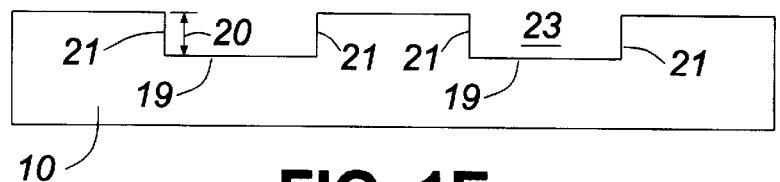
FIG. 1e illustrates removing of the mask from the wafer of FIG. 1d and the patterned structure formed on the wafer.

A method of cleaving a semiconductor according to the first embodiment of the invention was demonstrated using a GaAs semiconductor wafer. The method proceeds in three stage which are schematically illustrated in FIG. 1. First, the wafer 10 is patterned by selectively masking with a layer 12 of photoresist (FIG. 1a). In this example, the mask 12 has straight edges parallel to natural cleavage planes of the semiconductor material defined by crystallographic directions [100] and [010] as shown in FIG. 1a. The masked wafer is then implanted with a suitable dose of helium ions 14 which penetrate into unmasked regions 16 of the wafer 10, and most of them come to rest at a projected range (Rp) some distance below the surface 18 of the wafer 10, the distance defining a depth 20 of ion penetration as shown in FIG. 1b to 1d. The numeral 19 designates a Rp which defines a surface where the implanted ions are stopped. The implanted wafer is rapidly thermally annealed at a rate and temperature causing selective explosive exfoliation, as will be described in more detail below. Pieces 22 of GaAs are separated from the implanted regions leaving a complimentary structure with cavities 23 on the wafer (FIG. 1c). Thus the wafer 10 is patterned according to the details of the mask 12 to the depth 20 determined by ion implantation. FIG. 1d shows the wafer 10 after thermal annealing and exfoliation of the implanted regions with the mask 12 still on the wafer, the sidewall-facets of the complimentary patterned material remaining on the wafer being designated by numeral 21. Due to the specific orientation of the mask edges parallel to natural cleavage planes of the semiconductor material, the exfoliation of the material results in cleaving to form high quality sidewall-facets 21 of pieces of exfoliated material 22 and of the structure remaining on the wafer. Optionally, the mask 12 is then removed as shown in FIG. 1e.

The method will now be described in greater detail below. The wafer 10 is <100> oriented GaAs having thickness of several hundred micrometers and lateral dimensions of several cm. Optionally, the wafer is treated prior to performing the steps of the patterning method. An oxygen plasma descum is used to remove hydrocarbons, followed by a chemical etch to remove surface oxides (e.g. 1:10 $NH_4OH:H_2O$) by volume, for GaAs). A vapor treatment of hexamethyldisilazane is applied to promote resist adhesion.

To mask the wafer, the prepared wafer is coated with Shipley 1827 photoresist having a thickness of 3.5 micrometers using the SVG™ track and according to program instructions. The photoresist is soft baked on the SVG™ track according to further program instructions, and exposed with Cannon Wafer Stepper with an appropriate reticle for approximately 0.86 seconds to produce patterns of 50 to 100 micrometers dimension, typical for optoelectronic device structures. The wafer and reticle are oriented so as to achieve a pre-determined orientation of the mask pattern to the crystallographic of the wafer. The photoresist is then developed using SVG™ track and MF319 developer, and hard baked at about 110° C. on the SVG™ track. An oxygen descum is performed in a Tegal 901e providing removal of about 300 angstroms of the photoresist, after which the wafer is exposed to a deep UV light source to cross link the mask pattern and to reduce pattern distortion. Thus, the mask 12 on the surface of the wafer 10 is formed.

Ion implantation is performed by implanting a dose of $4 \times 10^{16}$ ions/cm$^2$ of helium ions 14, having energy of 3 MeV and penetrating into the wafer 10 to the depth 20 of about 4 micrometers. The implantation energy defines a depth at which exfoliation is required. This energy was calculated from commercially available simulation software, for example "TRIM", or from experimental measurement. A typical energy is of the order of 1 MeV for a range of depths of 1–2 microns, depending on the type of substrate. In practice, the ion energy may range between tens of eV to many MeV depending on the application. The dose to which the ions are implanted will depend to some extent on the energy, typically a deeper implant will require a higher dose to produce exfoliation. Typical implant doses are about $4 \times 10^{16}$ ions/cm$^2$ for a helium ion implantation and $1 \times 10^{17}$ ions/cm$^2$ for a hydrogen ion implantation. The temperature of the substrate during implantation is not critical if it is near room temperature, so that typical beam heating effects on the order of 50° C. (producing a substrate temperature of less than 100° C.) does not significantly affect the outcome of the process. For substrate temperatures significantly above room temperature, the implanted ions may diffuse out of the implanted region during the implantation step and therefore exfoliation may not occur.

The annealing step is performed in a rapid thermal annealer (RTA) where the temperature is rapidly (in 2–10 seconds) ramped up to about 350° C. after loading the wafer and purging the chamber (e.g. with nitrogen gas). This causes the implanted areas 22 to exfoliate from the wafer. Since exfoliation typically occurs during the temperature ramp-up, it is not necessary to hold the wafer at the final temperature for any length of time. Then the exfoliated pieces 22, which remain on the wafer, are blown off with filtered nitrogen and collected. If not already removed, the photoresist mask is stripped from the wafer and exfoliated pieces are processed by chemical solvents or by plasma ashing.

There is a minimum temperature required to achieve the exfoliation process. Exfoliation was not observed to occur below 300° C. for GaAs or InP substrates for the ion implantation and anneal conditions tested. In practice, the exfoliation process is more complete when the temperature ramped as quickly as possible to the minimum temperature. The exfoliation will occur almost instantaneously across the entire wafer once the critical temperature is reached. Heating beyond that point appears to have no additional effect on the exfoliation. There is a limit to how high an annealing temperature can be. III–V materials such as GaAs will begin to decompose noticeably at high temperatures, e.g. 800° C.; precautions can be taken to provide an overpressure, e.g. of P or As, during annealing to suppress surface decomposition. In practice there are likely to be other structures or devices on the wafer which will diffuse and be rendered inoperable at temperatures well below where the substrate material would decompose. Therefore, maximum temperature for exfoliation process is determined by practical maximum dictated by other devices or structures if they are also present on the wafer, and the need to minimize surface decomposition or other undesirable effects.

The physics of ion implantation induced exfoliation has been studied for many years. It was found that the implanted ions lead to the formation of small platelets of a size of a few nanometers between planes of the crystal. As the dose increases, more of the platelets are formed, and eventually they grow together to form voids or bubbles of tens of nanometers in diameter. The implanted ions form a pressurized gas within the bubbles. As the dose increases, presence of the voids in the crystal causes stress which eventually builds up to the point where plastic deformation occurs to relieve the stress, i.e. the formation of blisters and flaking of the caps of the blisters. At the point that this occurs, the blister is one large pressurized void. This will occur at random points across an implanted region and the blisters are typically quite large (1 millimeter).

In the experiments, the implant dose is sufficient to form small pressurized voids where they have not yet grown together. It is believed that the annealing step causes the pressure of the gas in these voids to increase to the point of plastic deformation. It is also believed that the voids are still quite small which is important for producing sharply defined boundaries between implanted and unimplanted regions, i.e. high quality sidewall-facets.

A series of experiments were performed, including patterning of GaAs and InP substrates according the description above with light ions of hydrogen and helium having energies within a range of 800 keV to 3 MeV and doses between $1 \times 10^{16}$ ions/cm$^2$ to $2 \times 10^{16}$ ions/cm$^2$. Masking was accomplished by three methods: patterned photoresist on GaAs and InP, by Au patterns on the InP/InGaAsP/InP structures and by thin Ni screens of various mesh dimensions (transmission electron microscopy sample grids). The Ni grids, with openings ranging between 50 and 250 microns on edge, were held in close proximity to the sample surface during implantation to provide square patterning. To avoid ion channeling the implantation is performed so that the angle between the ion beam and the normal direction to the wafer surface is about 70°.

Figure 2A:
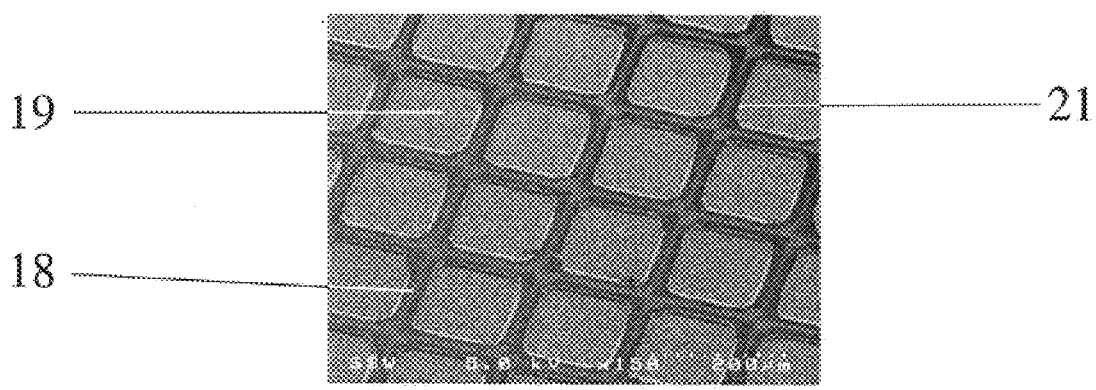
FIG. 2a is a top view SEM photograph of the patterned structure remaining on a GaAs wafer after exfoliation of the material according to the method of FIG. 1.
Figure 2B:
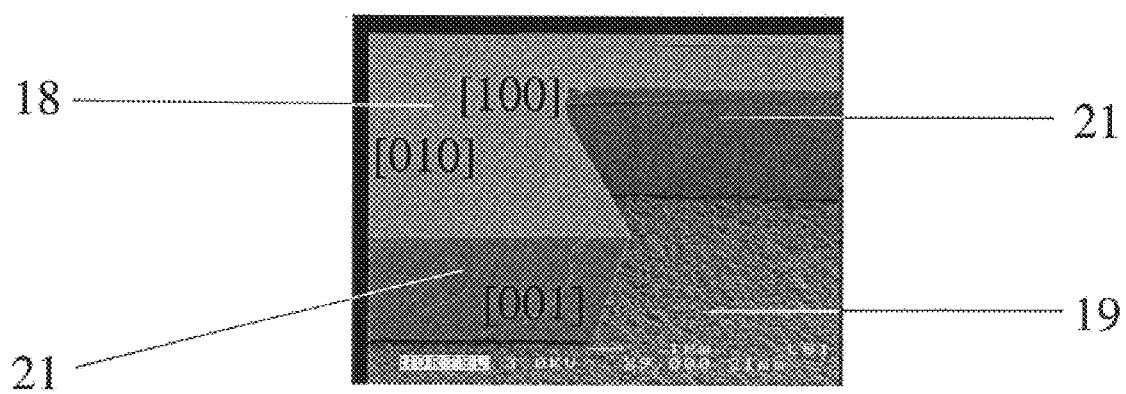
FIG. 2b is a SEM photograph of the cleaved wafer having high quality sidewall-facets.
Figure 3A:
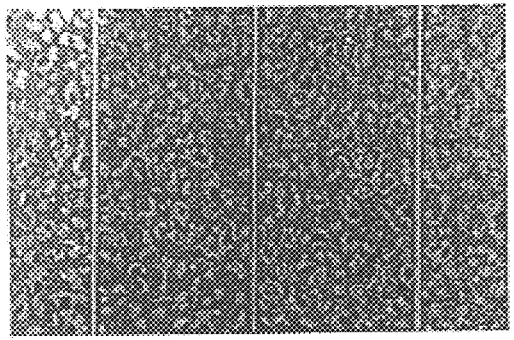
FIGS. 3a to 3d are SEM photographs of InP patterned wafers annealed at a ramp rate of 1° C./sec, 10° C./sec, 100° C./sec and 400° C./sec correspondingly.
Figure 3B:
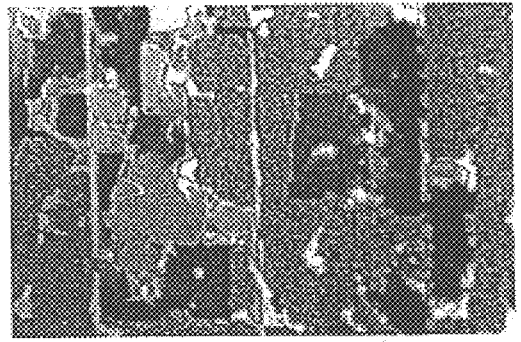
Figure 3C:
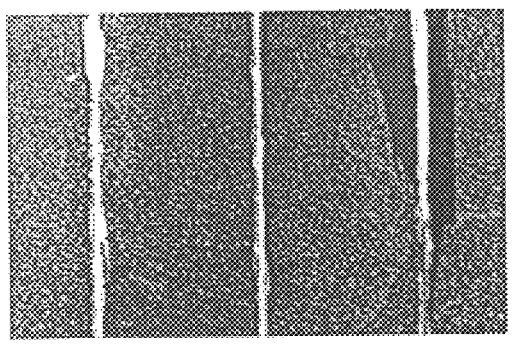
Figure 3D:
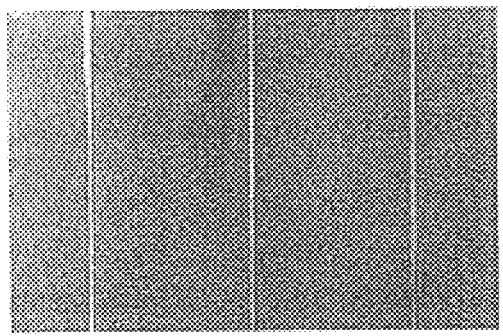
Figure 4:
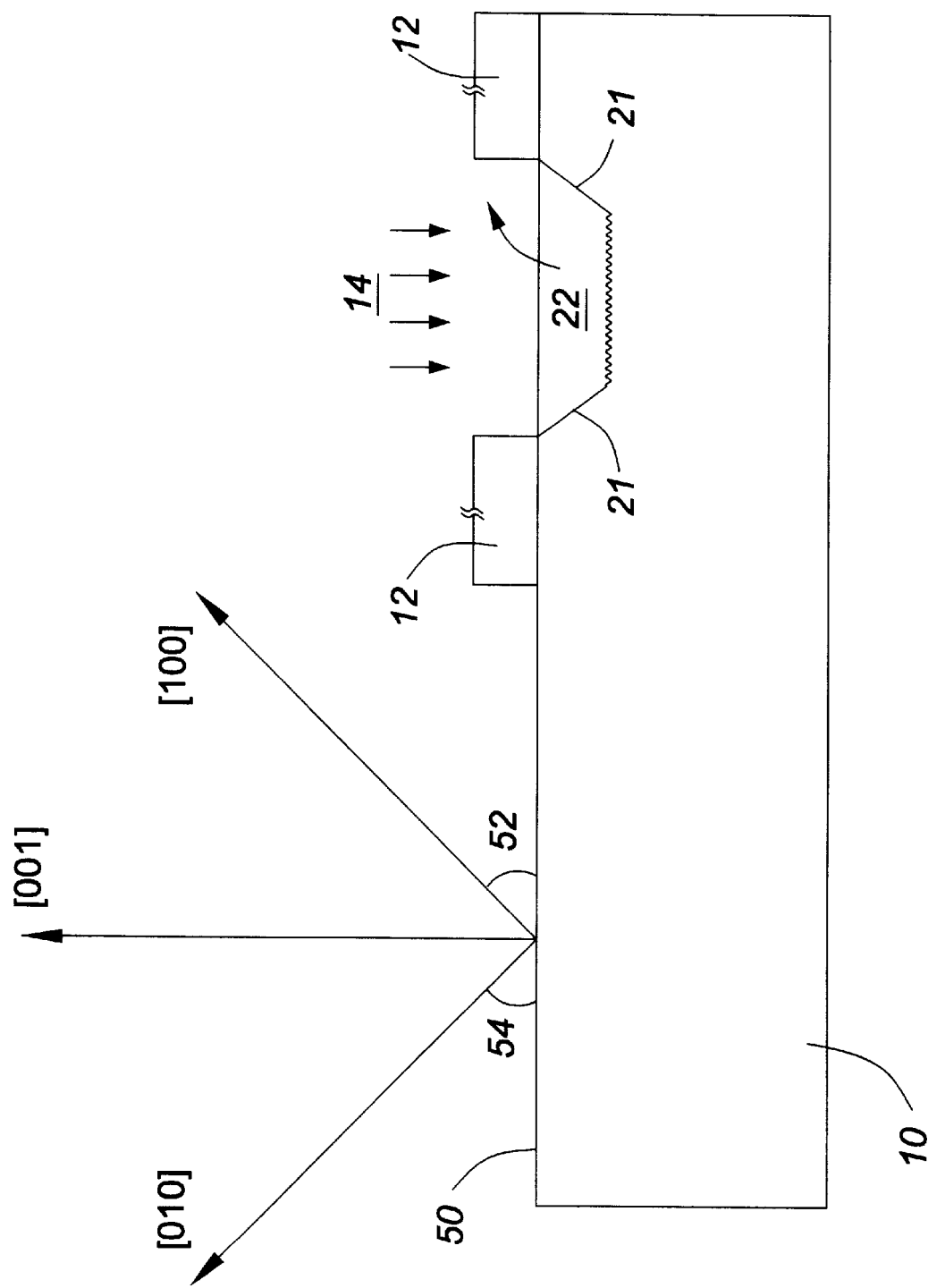
FIG. 4 illustrates formation of inclined sidewall-facets.
Figure 5A:
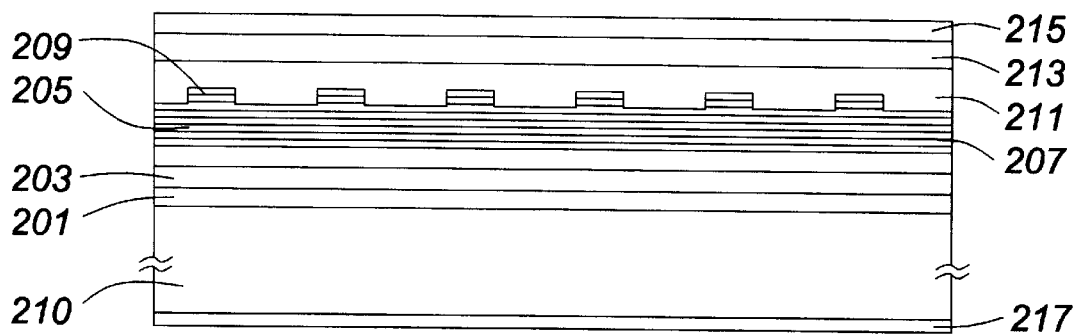
FIG. 5a illustrates an initial orientation of the wafer and formation of a laser structure thereon.
Figure 5B:
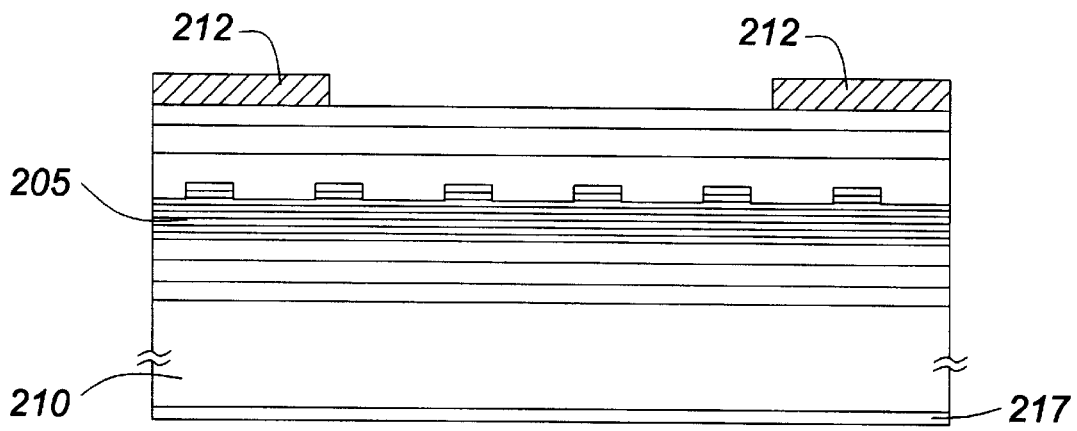
FIG. 5b illustrates patterning of the wafer of FIG. 5a with a mask.
Figure 5C:
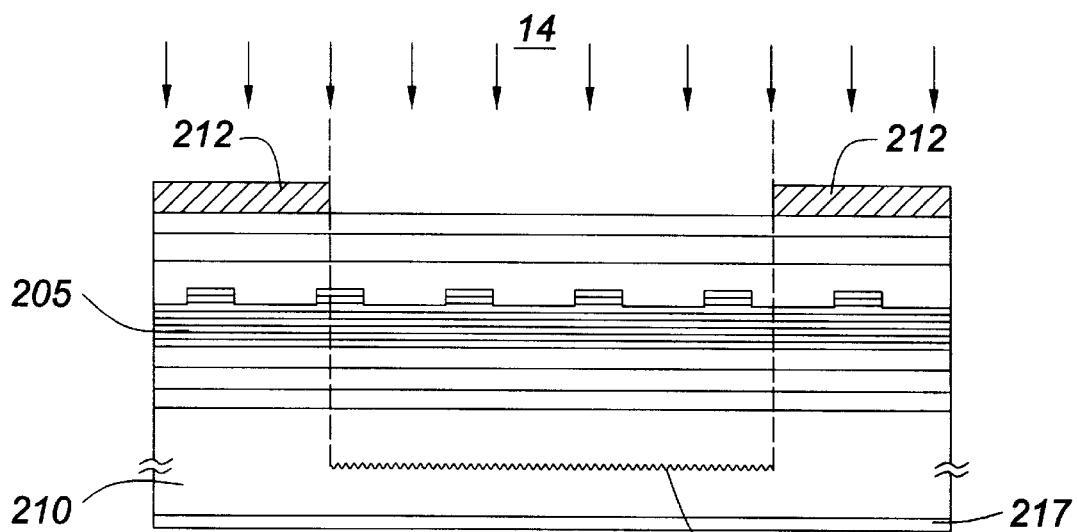
FIG. 5c illustrates ion implantation of the wafer of FIG. 5b.
Figure 5D:
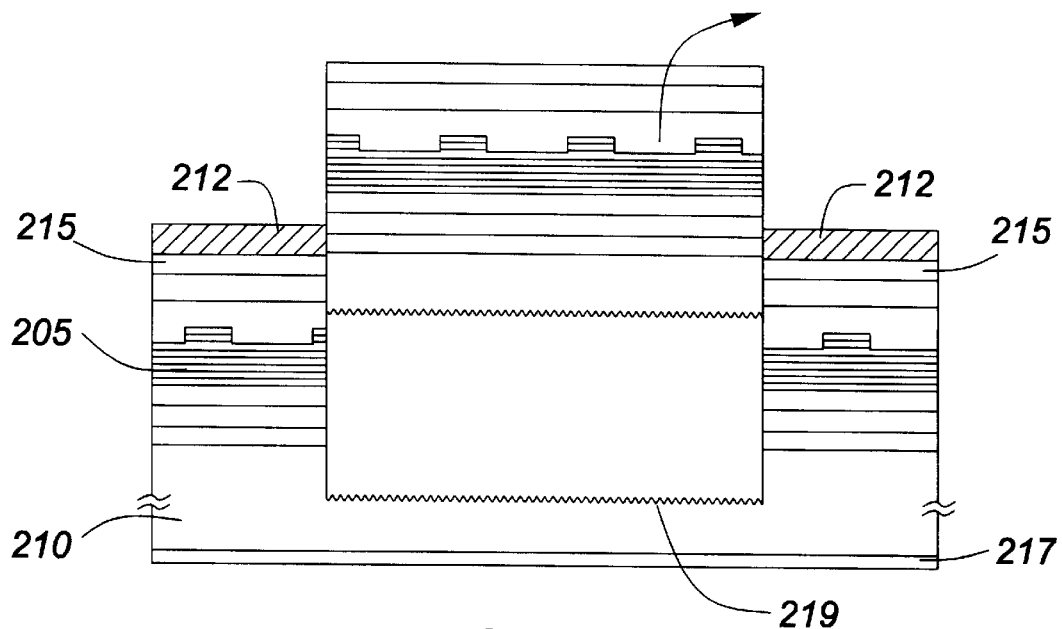
FIG. 5d illustrates thermal annealing of the wafer of FIG. 5c and exfoliation of the implanted regions.
Figure 5E:
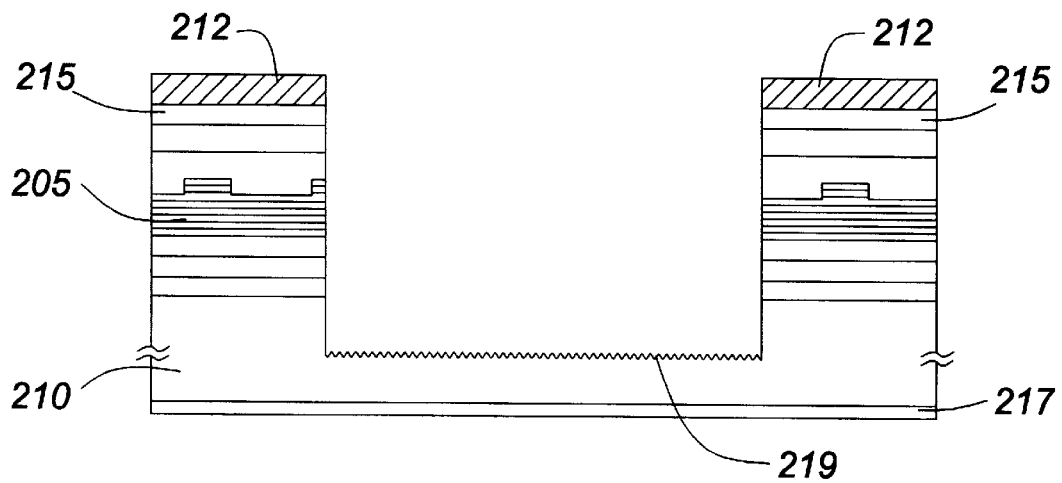
FIG. 5e illustrates a structure remaining on the wafer of FIG. 5d after thermal annealing and exfoliation of the inplanted regions.
Figure 5F:
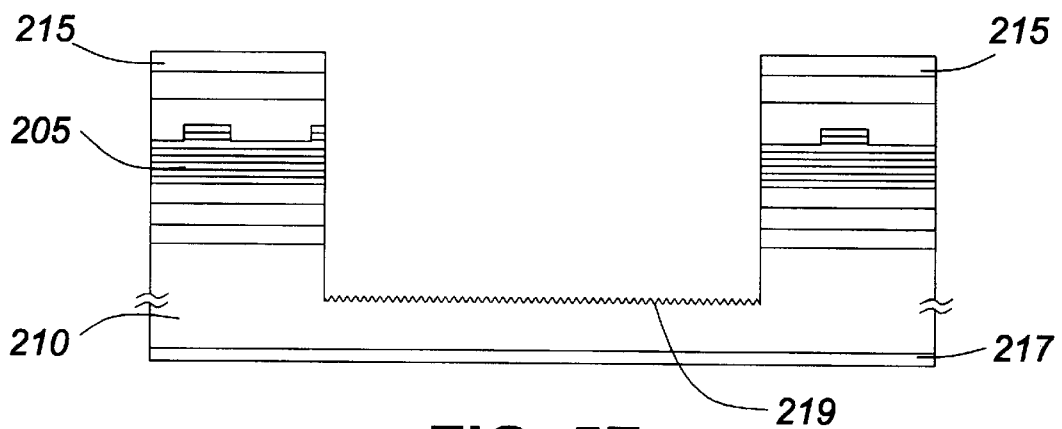
FIG. 5f illustrates removing of the mask from the wafer of FIG. 5e and the patterned structure formed on the wafer.

Typical results of the experiments are illustrated by FIGS. 2 to 4. FIG. 2a shows an electronic photograph of a top view of the single crystal InP patterned according to the grid. A three minute anneal at 350° C. of a sample of InP, which had been implanted with 450 keV energy protons to a dose of $1 \times 10^{17}$ cm$^{-2}$, resulted in the exfoliation of the material from the implanted areas. It is clearly seen that in the experiments where the mask had straight edges oriented along [010] and [100] directions as shown in FIG. 2b, exfoliation results in the formation of extremely high quality sidewall-facets 21 of pieces of the exfoliated material and of the patterned material at the boundaries of exfoliated regions. Similar to designations of FIG.1, numerals 18 and 19 in FIG. 2 represent the top of the wafer and the bottom of the cavity made on the wafer after exfoliation. The photoresist mask was stripped from the wafer before the picture was taken. Similar experiments were performed for GaAs wafer, and demonstrated similar results.

In FIG. 3, the importance of the temperature ramp rate is demonstrated. At the lowest ramp rate studied, 1° C./s, it appears that a single blister has formed in each implanted region (FIG. 3a). At a ramp rate of 10° C./s, exfoliation occurs; however, it is still variable across the sample and where it appears it is largely incomplete (FIG. 3b). An increase of the ramp rate to 100° C./s, as shown in FIG. 3c, dramatically changes the character of the exfoliation, which is now nearly total. By 400° C./s, FIG. 3d, the implanted regions are uniformly exfoliated and the unimplanted regions remain intact, without the imperfections observed at 100° C./s. Additionally, at the higher ramp rates the exfoliated material is observed to be primarily in the form of single blocks, released intact from the implanted regions. These release characteristics suggest that rapid temperature ramp produces a laterally more uniform force on the overlayer, forcing it away from the substrate and forming the sidewalls along the perimeter via cleavage. At lower ramp rates, the voids are likely to combine to form a single blister which may then crack open, releasing the trapped gas.

Alternative embodiments of the method may include repetition of the steps of masking and implanting a number of times before the annealing. It is possible with an appropriate selection of a variety of masks providing desired exfoliation of the material and cleaving of the wafer. The masks may be removed after each implantation, or, alternatively, all the masks may be removed together either before or after the annealing step.

In another embodiment it is also contemplated that the steps of implanting and annealing may be repeated as many times as needed, using a single or multiple masks, and performing an annealing step takes place after each implantation. The masks may be removed each time either immediately before or immediately after the annealing step. Alternatively, multiple masks may be removed at the end of the process. It is necessary to keep in mind that when several masks are formed on the surface of the material simultaneously, they must have specific pattern structures providing desired exfoliation of the material.

Numerous modifications can be made to the embodiments described above.

The wafer material 10 chosen to be GaAs or InP in the first embodiment may be substituted by other semiconductor materials which are brittle enough to cause selective exfoliation and to allow formation of pressurized voids during implantation. They may be multi-layered semiconductor structures. The mask 12 chosen to be made of photoresist in the first embodiment may be formed of other materials, e.g. metals (aluminum, gold, nickel), dielectrics (silicon dioxide, silicon nitride) or a combination thereof. The requirements for the mask, materials include the mask to be thick enough to stop the implanted ions from reaching the substrate through the mask, and to be robust enough to withstand the implantation process without significant deformations. Preferably straight edges of the mask should be aligned with natural cleavage planes to produce high quality wall/facet. The mask can be removed by chemical etching, plasma ashing or any other technique which would not destroy the patterned structure. When the plasma ashing is used, care must be taken not to heat the wafer to the temperature of annealing as this may reduce or prevent effectiveness of the exfoliation anneal. Ion implantation which is done with H and He in the first embodiment can alternatively be done with other ions, e.g. ions of inert gases or isotopes thereof. The requirement for the type of ions is not to damage the surface of the wafer substantially and to form pressurized voids within the material which cause stress and further plastic deformation of the material.

The orientation of the wafer with respect to the incident ion beam and to crystallographic directions of the material of the wafer is an important parameter. When the wafer is cut so as its planes make pre-determined angles with natural cleavage planes of semiconductor material, the exfoliation may result in formation of sidewall-facets which are inclined at pre-determined angles. For example, FIG. 4 illustrates a situation where the wafer surface 50 makes 45 degree angles 52 and 54 with crystallographic directions [100] and [010] respectively. In this situation the exfoliation of the material is likely to result in formation of sidewall-facets 21 inclined at 45 degrees to the surface of the wafer.

A method of cleaving a semiconductor wafer to define optoelectronic devices, such as laser structures, modulators, amplifies, etc., according to a second embodiment of the invention is schematically shown in FIG. 5. By way of example it is shown for manufacturing of DFB lasers. First, a heavily P-doped InP wafer 210 is provided. The surface of the wafer is perpendicular to [001] direction while [010] and [100] crystallographic directions are parallel to the wafer surface (FIG. 5a). Laser structures are formed within the surface of the wafer in a conventional manner. For example, a P-doped InP buffer layer 201 followed by a confinement layer 203 are formed on the wafer. An active region 205 comprising a multiple quantum well structure 207 and a grating structure 209 are then defined thereon, and an overlying confinement layer 211 and confining ridge 213. A top electrode 215 and a bottom electrode 217 for current injection into the active region 205 complete the structure. After completion of the laser structure as above, the wafer 210 is patterned with a mask 212 of photoresist (FIG. 5b). The mask has straight edges parallel to natural cleavage planes of the semiconductor material defined by crystallographic directions [100] and [010] as shown in FIG. 5b. The masked wafer is implanted with a suitable dose of helium ions 214, which penetrate into unmasked regions 216 of the wafer 210 below the active region 205, and the majority of them come to rest at a projected range (Rp) some distance below the surface 218 of the wafer 210, the distance defining a depth 220 of ion penetration as shown in FIGS. 5c to 5e. The numeral 219 designates a surface along which the majority of implanted ions are stopped and a lower surface 219 of pieces 222 of the wafer 210 to be removed by exfoliation. Then the implanted wafer is rapidly thermally annealed at a rate and temperature causing selective explosive exfoliation of pieces 222 of the wafer from the implanted regions along surface 219 leaving a complimentary structure with cavities 223 on the wafer (FIG. 5d). Thus the wafer 210 is cleaved along <100> direction according to the pattern of the mask 212 to the depth 220 determined by ion implantation. FIG. 5e shows the wafer 210 after thermal annealing and exfoliation of the implanted regions with the mask 212 still on the wafer, the sidewall-facets of the complimentary patterned material remaining on the wafer being designated by numeral 221. Due to the specific orientation of the mask edges parallel to natural cleavage planes of the semiconductor material, the exfoliation of the material causes cleaving to form high quality sidewall-facets 221 of pieces of exfoliated material 22 and of the structure remaining on the wafer. If required, the mask 212 is then removed as shown in FIG. 5f. The patterned structure remaining on the wafer after exfoliation forms a first set of laser devices. The collected pieces of exfoliated material form a second set of laser devices. The sidewall-facets form laser facets for each set. The orientation of sidewall-facets depends on orientation of the direction of ion implantation with respect to the crystallographic directions of the wafer, which allows, for example, to form vertical facets or facets inclined at a pre-determined angle. After cleaving, the first and second sets of laser structures may be tested, beneficial testing of the first set of laser structures is performed on the wafer.

Advantageously, the method includes the step of coating laser facets of the first set of laser devices before detaching laser devices of the first set from the wafer in a conventional manner. Other modifications and variations described above with respect to the first embodiment of the invention are applicable to the second embodiment.

Although specific embodiments of the invention have been described in detail, it will be apparent to one skilled in the art that variations and modifications to the embodiments may be made within the scope of the following claims.

What is claimed is:

1. A method of cleaving a semiconductor wafer, comprising the steps of:

selectively masking a semiconductor wafer;

ion implanting unmasked regions of the wafer to a pre-determined depth;

annealing the wafer to cause exfoliation of the wafer material from the implanted regions.

2. The method of claim 1, wherein the step of masking provides arranging a mask so as to provide that edges of the mask are parallel to the natural cleavage planes of the semiconductor material.

3. The method of claim 2, comprising removing the mask before the annealing.

4. The method of claim 2, comprising removing the mask after the annealing.

5. The method of claim 2, wherein the step of annealing comprises rapid thermal annealing.

6. The method of claim 1, wherein the step of annealing comprises rapid thermal annealing, laser beam annealing, electron beam annealing, ion beam annealing, furnace annealing or a combination thereof.

7. The method of claim 2, the ions being selected from the group consisting of ions of hydrogen, helium, neon, and isotopes thereof.

8. The method of claim 2, further comprising a step of repeating the steps of masking and implanting a pre-determined number of times before performing the step of annealing, the patterns of the masks being selected so as to provide desired cleaving of the wafer.

9. The method of claim 2, further comprising a step of repeating the steps of masking, implanting and annealing a pre-determined number of times, the patterns of the masks being selected so as to provide a desired cleavage of the wafer.

10. The method claim 2, comprising selective implantations in different areas of the wafer to cleave the wafer in different areas to different depths.

11. The method of claim 2, wherein the providing of a masking selected from a group consisting of a metal, a dielectric, an organic material, and a combination thereof.

12. The method of claim 11, wherein the metal is one of gold, aluminum, nickel and alloys thereof.

13. The method of claim 12, wherein the dielectric is one of silicon dioxide and silicon nitride.

14. The method of claim 11, the mask being formed by use of photo-lithography, etching and lift-off techniques.

15. The method of claim 3, the removing of the mask being performed by the process selected from the group consisting of plasma ashing, chemical etching, mechanical polishing, and ion etching.

16. The method of claim 4, the removing of the mask being performed by the process selected from the group consisting of plasma ashing, chemical etching, mechanical polishing, and ion etching.

17. A method of cleaving a semiconductor wafer to define optoelectronic devices, comprising the steps of:

forming an optoelectronic device structure within the surface of the wafer;

selectively masking a semiconductor wafer with a mask having straight edges parallel to natural cleavage planes of the semiconductor material;

ion implanting unmasked regions to a pre-determined depth;

annealing the wafer to cause exfoliation of the wafer material from the implanted regions.

18. The method of claim 17 wherein the optoelectronic devices comprise laser devices having active regions formed in the wafer.

19. The method of claim 17 comprising removing the mask before the annealing.

20. The method of claim 17 comprising removing the mask after annealing.

21. The method of claim 18, wherein the step of ion implantation to a predetermined depth provides ion implantation into the wafer below the active region.

22. The methoc of claim 17, further comprising the step of forming a first set of laser devices from the patterned structure remaining on the wafer with sidewall-facets serving as laser facts.

23. The method of claim 17, further comprising the step of forming a second set of laser devices from collected pieces of exfoliated material with the sidewall-facets serving as laser facets.

24. The method of claim 17, wherein the step of ion implanting comprises the step of providing a predetermined direction of ion implantation with respect to the crystallographic directions of the material of the wafer.

25. The method of claim 22, further comprising the step of coating laser facets of the first set of laser devices.

26. The method of claim 25, further comprising the step of detaching laser devices of the first set from the wafer.

* * * * *